FIELD-EFFECT TRANSISTOR TRANSLATING CIRCUIT

Filed April 19, 1963 3 Sheets-Sheet 1

INVENTOR.
GERALD E. THERIAULT
BY Eugene M. Whitacre
Attorney

FIELD-EFFECT TRANSISTOR TRANSLATING CIRCUIT

Filed April 19, 1963 3 Sheets-Sheet 2

INVENTOR.
GERALD E. THERIAULT
BY Eugene M. Whitacre
Attorney

FIELD-EFFECT TRANSISTOR TRANSLATING CIRCUIT

Filed April 19, 1963 3 Sheets-Sheet 3

INVENTOR.
GERALD E. THERIAULT
BY Eugene M. Whitacre
ATTORNEY

United States Patent Office 3,260,948
Patented July 12, 1966

3,260,948

FIELD-EFFECT TRANSISTOR TRANSLATING CIRCUIT

Gerald E. Theriault, Hopewell, N.J., assignor to Radio Corporation of America, a corporation of Delaware Filed Apr. 19, 1963, Ser. No. 274,182
10 Claims. (Cl. 330—18)

This invention relates in general to electrical circuits employing semiconductor devices and more particularly to signal translating circuits having automatic gain control.

In the design of gain controlled radio frequency (R-F) amplifier stages including semiconductor devices such as transistors, a serious problem has been noted with respect to cross modulation distortion. Cross modulation may be defined as the transfer of the modulation of an undesired carrier wave to the desired carrier wave. As signal level increases from a minimum useable level, it is common practice to apply an automatic gain control (AGC) voltage to the device in a direction to decrease its output current and gain so that succeeding signal translating stages will not be overloaded. The transfer characteristic of known semiconductor devices changes as the gain is reduced so that a relatively small amount of interfering signal produces relatively high cross modulation distortion of the signal being amplified as compared to amplifier circuits using tubes or the like. Unfortunately, most known semiconductor devices exhibit poor cross modulation characteristics over a large AGC range. The AGC range of an amplifier may be defined as the maximum change in transconductance of the active element in an amplifier circuit, for example.

In order to reduce the cross modulation distortion of such circuits it has been proposed that the amplifier gain be reduced by applying a control voltage which tends to increase the output current of the semiconductor device as the input signal level increases. The cross modulation distortion produced in a circuit of this type is substantially reduced as compared to the circuit where the gain is reduced by reducing the device output current. However, it has been found that as the device output current increases, its effective output impedance decreases. The decreased effective output impedance loads the tuned output circuit of the amplifier, and undesirably broadens the frequency bandpass characteristics thereof. Under such conditions, undesired signals which are passed to succeeding stages may be of an amplitude to cause undesirably high cross modulation distortion in succeeding stages.

Accordingly, it is an object of this invention to provide an improved variable gain signal translating circuit, employing semiconductor devices such as transistors, which exhibits low cross modulation distortion.

It is another object of this invention to provide a tuned high frequency variable gain signal translating circuit, which employs field-effect semiconductor devices, with low cross modulation distortion.

It is still another object of this invention to provide an improved variable gain high frequency tunable amplifier circuit having low cross modulation distortion and a relatively constant passband characteristic within the AGC range.

It is a further object of this invention to provide an improved variable gain cascode amplifier circuit employing field-effect transistors, which circuit exhibits low cross modulation distortion and has an extended AGC range.

A signal translating circuit embodying the invention comprises first and second semiconductor devices each having a control electrode and first and second electrodes defining a current path. The first and second semiconductor devices are connected so that the current paths defined by the first and second electrodes of each of the semiconductor devices are connected in series, with the series connected devices being across a tuned or tunable output circuit. The control electrode of the first semiconductor device is coupled to a signal input circuit and the control electrode of the second semiconductor device is coupled to a point of reference potential for signal frequencies. A gain control circuit is coupled to the control electrode of the first device to provide a control voltage that varies as a function of the amplitude of the input signal so that as the input signal level increases, the control voltage biases the first device in a direction which tends to increase the current flow through the current path defined by the first and second electrodes thereof. This action results in a decrease in the amplitude of the output signal derived from the output circuit coupled across the series connected semiconductor devices.

In accordance with a feature of the invention a fixed bias may be applied between the control and one of the first and second electrodes of the second device, the polarity and magnitude of which controls the AGC range, or amount of gain reduction.

In accordance with another feature of the invention, a gain control voltage may be applied to the second device, which varies with signal level in a direction tending to decrease current flow through that device to extend the AGC range.

The novel features which are considered characteristic of the invention are set forth with particularity in the appended claims. The invention itself, however, both as to its organization and method of operation as well as additional objects and advantages thereof will best be understood from the accompanying drawings in which:

Figure 1:
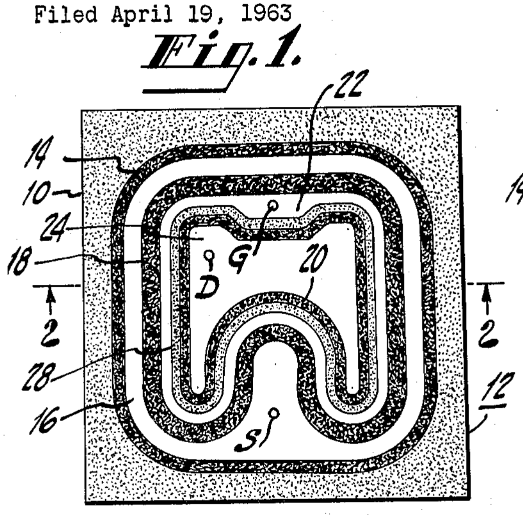
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example lightly doped P-type silicon of 100 ohm cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
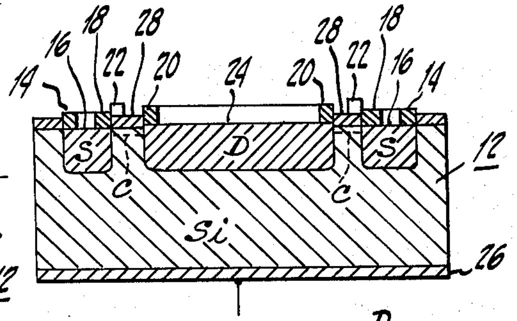
FIGURE 2 is a cross sectional view taken along section lines 2—2 of FIGURE 1.

The body 12 is then heated in a suitable atmosphere such as in water vapor so that exposed silicon areas are oxidized to form grown silicon dioxide layers indicated by the lightly stippled areas of FIGURE 1. During the heating process, impurities from the deposited silicon dioxide layer diffuse into silicon body 12 to form the source and drain regions. FIGURE 2, which is a cross sectional view taken along section line 2—2 of FIGURE 1, shows the source-drain regions labelled S and D respectively.

By means of another photo-resist and acid etching or like step the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first more darkly stippled zone 14 is grown silicon dioxide. The white area 16 is the metal electrode corresponding to the source electrode. Dark zones 14 and 18 are deposited silicon dioxide zones overlying a portion of the diffused source region, and the dark zone 20 is a deposited silicon dioxide zone overlying a portion of the diffused drain region. White areas 22 and 24 are the conductive electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The input resistance of the device at low frequencies is of the order of $10^{14}$ ohms. The layer of grown silicon dioxide 28 on which the gate electrode 22 is mounted, overlies an inversion layer or channel C connecting the source and drain regions. As shown, the gate electrode 22 is displaced towards the source region S and may be constructed to overlap the deposited silicon dioxide layer 18.

The boundaries separating the source and drain regions S and D and the body of silicon substrate 12, as shown in FIGURE 2 of the drawings, effectively operate as a pair of rectifying junctions respectively coupling the source and drain electrodes 16 and 24 to the silicon substrate 12. The anode electrode of each of the rectifying junctions is coupled to the substrate so that bias voltage applied to the substrate which is positive with respect to the voltage at the drain and source electrodes 16 and 24, renders the rectifying junctions conductive.

The poling of the rectifying junctions described is representative of a transistor of the type described in connection with FIGURES 1 and 2 where the substrate is of P-type material relative to the source and drain electrodes. However, the transistor device can be fabricated with an N-type material substrate relative to the source and drain electrodes. In devices of the latter type, the rectifying junctions would be poled such that the anode side of the rectifying junction appears at the source and drain electrodes, and the cathode side of these junctions appears at the substrate. The devices shown in the subsequent figures will be of the type of device described in connection with FIGURES 1 and 2 wherein the substrate is of P-type relative to the source and drain electrodes.

Figure 3:
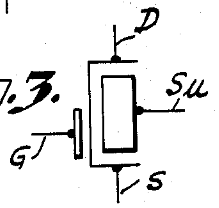
FIGURE 3 is a symbolic representation of an insulated-gate field-effect transistor.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and the source electrodes as a function of the polarity of the bias potential applied therebetween; i.e., the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers in this case (electrons) flow from source-to-drain in this thin channel region close to the surface. The conductive channel C is shown in FIGURE 2 in dotted lines.

Figure 4:
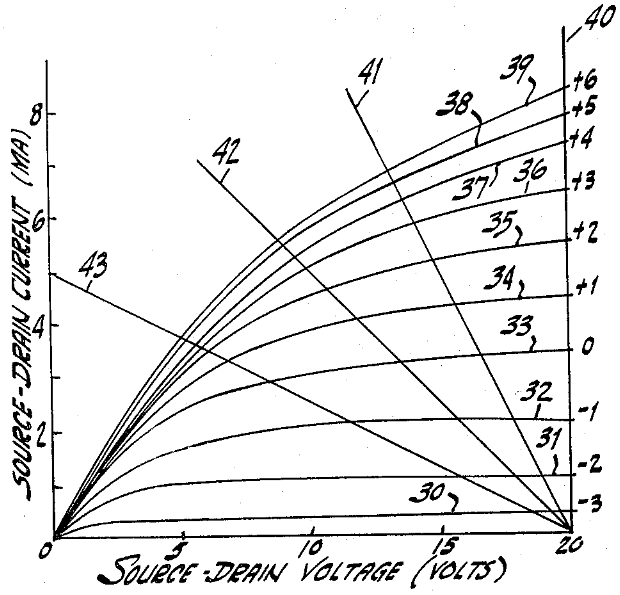
FIGURE 4 is a graph showing a family of drain current versus source-to-drain voltage curves for various values of gate-to-source voltages of the transistor of FIGURE 1.

FIGURE 4 of the drawings is a graph showing a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. The location of th zero bias curve is selected during the manufacture of the transistor. One way of establishing a desired zero bias curve is by controlling the time and/or temperature of the step of the process when the silicon dioxide layer 28 shown in FIGURES 1 and 2 is grown.

In FIGURE 4 the curve 33 corresponds to the zero bias gate-to-source voltage. Curves 34–39 represent positive gate voltages relative to the source, and the curves 30–32 represent negative gate voltages relative to the source.

FIGURE 4 also shows various load lines 40–43 of an amplifier circuit employing an insulated-gate field-effect transistor as its active element. Load lines 40–43 correspond to load impedance values of zero ohms, 1,000 ohms, 2,000 ohms and 4,000 ohms, respectively.

The distance between adjacent drain current versus source-drain voltage curves becomes smaller as the gate-to-source bias voltage increases in the positive direction, which indicates a decrease of the circuit transconductance ($g_m$) which is defined as the incremental change in output current (drain current) for an incremental change in input voltage (gate-to-source bias voltage). The value of transconductance differs depending on the loading of the signal translating circuit. For example, along load line 40 (zero ohms) a change of 1 volt (from +5 volts to +6 volts) in the gate-to-source bias voltage, corresponds to a change of drain current of approximately .5 milliamperes; while the same 1 volt change in the gate-to-source bias voltage along load line 43 amounts to a change in drain current of approximately .07 milliamps. The value of $g_m$ also depends on the operating point of the active element. For example, a gate-to-source bias voltage change from zero volts to +1 volt along the load line 40 results in a change in drain current of approximately 1.5 milliamps, while a similar change along load line 43 is less than 1 milliamp.

Figure 5:
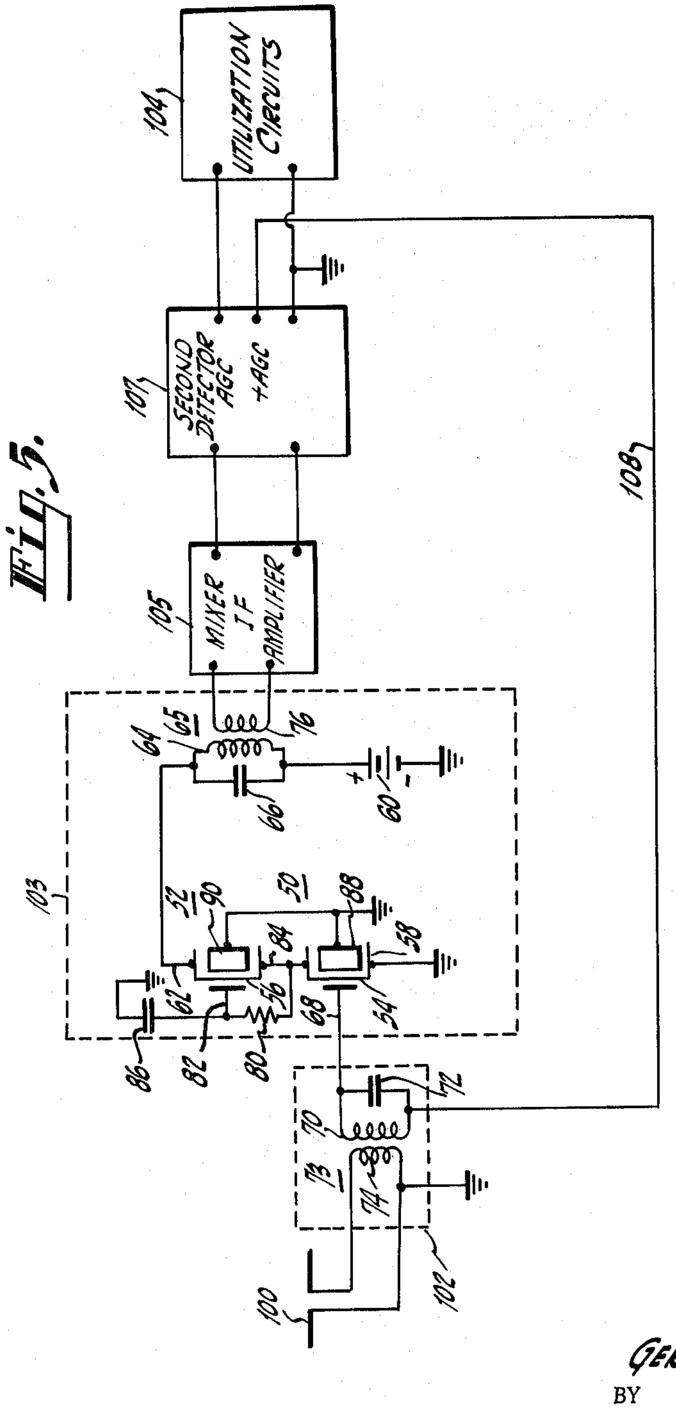
FIGURE 5 is a schematic circuit diagram partially in block form of a signal receiver embodying the invention.

Reference is now made to FIGURE 5 of the drawings which is a schematic circuit diagram, partially in block form, of a signal receiver. Input signals are received by an antenna 100 and coupled to the amplifier 103 through a coupling network 102 which includes the primary winding 74 of the transformer 73. The input signals are inductively coupled from the primary winding 74 to the secondary winding 70 of the transformer 73. The secondary winding 70 is tuned by a capacitor 72 to a desired frequency. Capacitor 72 may be a variable capacitor so that the signal input circuit may be tuned at different frequencies.

The amplifier 103, which is sometimes called a cascode amplifier, comprises insulated-gate field-effect transistors 50 and 52 having their source-drain current paths 54 and 56 connected in series. The source electrode 58 of the field-effect transistor 50 is connected to a point of fixed reference potential shown as ground. The drain electrode 62 of the field-effect transistor 52 is in turn coupled through a tuned output circuit to the positive terminal of a source of operating potential shown as a battery 60. The tuned output circuit includes a capacitor 66 connected across the primary winding 64 of an output transformer 65.

The gate electrode 82 of field-effect transistor 52 is referenced to ground for signal frequencies through a capacitor 86 to provide isolation between the drain electrode 62 and the source electrode 84 of the transistor 52.

A resistor 80 is connected between the gate electrode 82 and the source electrode 84 to provide zero gate-to-source bias operation of the transistor 52. If desired, a fixed bias voltage, not shown, may be applied between the gate electrode 82 and source electrode 84.

The cascode amplifier 103 thus comprises a gate-input grounded-source transistor 50 driving a source-input grounded-gate output transistor 52. Such a circuit provides good stability in that the transistor 50 is loaded by the low input impedance of the transistor 52, and the signal grounded gate electrode 82 of the transistor 52 reduces signal feedback from the drain electrode 62 to the source electrode 84.

It has been noted that in such circuits the amount of stable gain which can be achieved is somewhat limited unless the feedback between the drain electrode 62 and source electrode 84 through the substrate 90 of the transistor 52 is substantially eliminated by the grounding of the substrate 90. The grounded substrate electrode 90 also serves to prevent signal distortion which might otherwise occur due to signal rectification in the rectifying junctions effectively existing between the substrate 90 and the source electrode 84 as well as between the substrate 90 and the drain electrode 62. It will be noted that the substrate electrode 88 of the transistor 50 is also connected to ground.

Output signals are coupled from the secondary winding 76 of the transformer 65 to a suitable mixer IF amplifier circuit 105. The IF amplified signal from the IF amplifier of the circuit 105 is coupled to a second detector 107 which provides an automatic gain control voltage at the output conductor 108 which varies as a function of the average amplitude of the input signal level. The second detector circuit 107 is coupled to a utilization circuit 104 which may include audio amplifiers, video amplifiers and the like.

The AGC output signal from the second detector 107 is coupled via conductor 108 to the signal input circuit of the amplifier 103 to control the gain thereof. The detector circuit 107 is connected in such a manner that the AGC voltage becomes more positive as the amplitude of the input signal increases.

Figure 6:
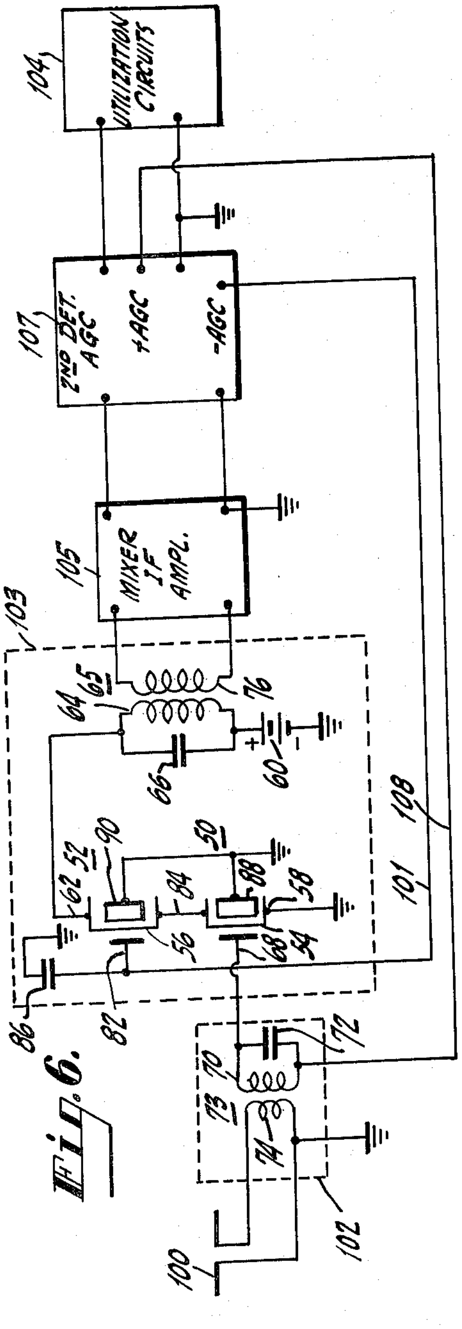
FIGURE 6 is a schematic circuit diagram partially in block form of another signal receiver embodying a modification of the invention.

An alternative embodiment of the invention, which is shown in FIGURE 6, is similar to that shown in FIGURE 5 except that an AGC voltage is also applied to the transistor 52. In this embodiment of the invention the second detector 107 develops a second AGC voltage which becomes more negative as the signal level increases. The second AGC voltage, which appears at the conductor 101, is applied to the gate electrode 82 of the transistor 52. If desired, the second AGC voltage at the conductor 101 may be delayed relative to the first AGC voltage appearing at the conductor 108. The gate electrode 82 of the transistor 52 may be biased at a desired potential with respect to the source electrode 84 for low signal levels so as to provide maximum gain and low cross modulation distortion. The circuit of FIGURE 6 is found to provide excellent cross modulation characteristics (low distortion) while enabling gain control over a wide range from a maximum gain condition to heavy attenuation of the applied signal.

Figure 7:
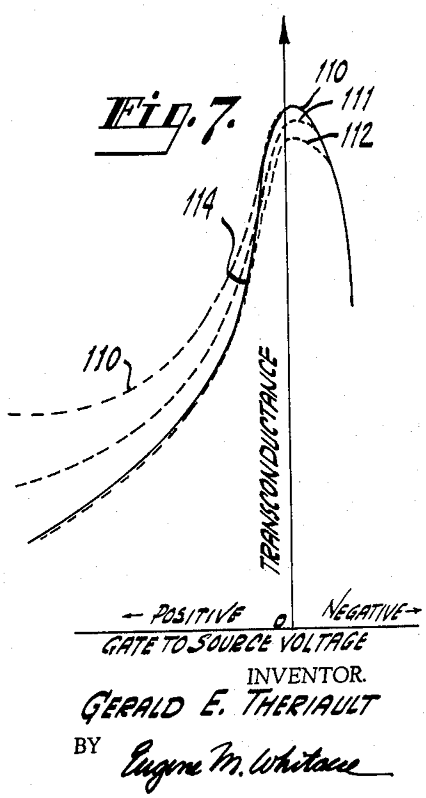
FIGURE 7 is a graph showing the transconductance versus gate-to-source bias voltage characteristic curves of the circuit shown in FIGURE 5 for various values of gate-to-source bias voltage of the grounded gate stage.

Reference is now made to FIGURE 7, which is a graph showing a family of transconductance versus gate-to-source bias voltage curves taken from the circuit shown in FIGURE 5. FIGURE 7 shows that as the gate-to-source (68 to 58) bias voltage increases in the negative direction from the point of maximum $g_m$, the value of the $g_m$ of the circuit decreases rapidly. The greater the rate of change of transconductance (a steep slope) per unit change of control bias voltage, the greater the cross modulation distortion. The curves 110, 111 and 112 were plotted for different values of fixed bias between the gate electrode 82 and the source electrode 84. The curve 110 represents zero gate-to-source bias voltage, and the curves 111 and 112 respectively represent conditions where the gate electrode 82 is one and two volts negative with respect to the source electrode 84.

FIGURE 7 shows that the transconductance versus gate-to-source bias voltage characteristic is substantially the same for increasing negative gate-to-source bias voltages. FIGURE 7 also shows that as the gate-to-source bias voltage increases in a positive direction the value of transconductance decreases, but at a much lower rate than when the bias voltage increases in the negative direction. Since the cross modulation distortion increases as the slope of the transconductance characteristic increases, less cross modulation is encountered for a given bias voltage change from the maximum gain condition in the positive direction, than for a like change from the maximum gain condition in the negative direction. The gate-to-source bias voltage for the maximum $g_m$ condition will depend on the particular transistor device employed in the circuit.

Before considering the operation of the circuits shown in FIGURES 5 and 6, it should be noted that it has been suggested in the prior art to apply a gain controlling voltage to a transistor which is in a direction to reduce its gain by increasing the output current. For relatively high level input signals, the transistor is driven into heavy conduction which tends to load or damp the tuned output circuit thereby broadening its frequency response characteristic. In such a circuit an interfering signal which might otherwise be heavily attenuated by the signal output circuit is passed to succeeding stages and can produce cross-modulation distortion therein.

In the circuit of FIGURES 5 and 6, the AGC voltage applied from the second detector 107 to the gate electrode 68 of the transistor 50 becomes more positive as the signal level increases. The absolute value of the gate-to-source bias voltage at sensitivity levels (weakest useable signals) may be positive or negative depending on the particular characteristics of the transistor used in the circuit. In the present case, for the weakest levels of signals to be received, the gate electrode 68 is biased at about zero volts in order to provide the maximum gain or maximum transconductance for the weakest signals.

The transistor 52 in series with the transistor 50 provides a substantially constant and relatively high dynamic impedance over the AGC voltage range, and hence prevents the transistor 50 from loading or damping the tuned output circuit comprising the primary winding 64 and the capacitor 66. In addition, the transistor 52 is biased at a point at which the slope of the bias voltage versus transconductance curve is relatively flat (horizontal) so that this stage contributes very little cross modulation distortion. Still further, the amount of interfering signal which is actually applied to the transistor 52 is attenuated in amplitude relative to the amplitude of the interfering signal applied to the transistor 50, since the transistor 50 has a voltage gain of less than unity. Accordingly, the bulk of the cross modulation distortion in the circuit of FIGURE 5 is produced by the transistor 50; and due to the fact that the AGC voltage tends to increase the output current as the input signal level increases, the cross modulation distortion of the circuit is considerably less than that which occurs in circuits wherein the AGC voltage tends to reduce the output current as the input signal level increases.

Figure 8:
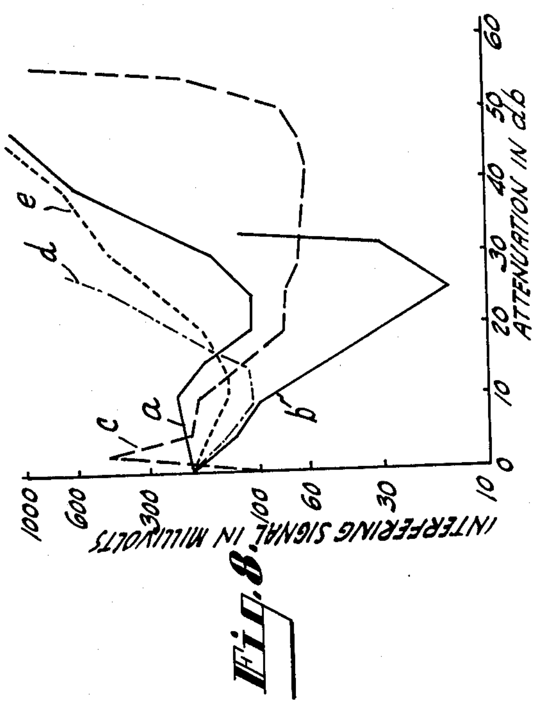
FIGURE 8 is a graph showing the amount of interfering signal required to produce 1% cross modulation as a function of attenuation for various types of amplifier circuits.

Reference is now made to FIGURE 8 of the drawings which shows the interfering signal required (in millivolts) at the input circuit of the amplifier to obtain 1% cross modulation distortion as the gain of the amplifier is attenuated. Curve *a* is an exemplary curve representing the cross modulation characteristics of a high frequency amplifier using a single transistor to which is applied an AGC voltage that tends to increase the output current from the transistor as the input signal increases. Curve *b* is an exemplary curve representing the cross modulation characteristic of a high frequency amplifier using a single transistor to which is applied an AGC voltage that tends to decerase the output current from the transistor as the input signal increases. Curve *c* is obtained from an amplifier circuit employing a triode vacuum tube such as a 6WC4 as the active element of the amplifier circuit, by applying an AGC voltage that tends to decrease the output current as the input signal increases. Curves *d* and *e* respectively represent the cross modulation characteristic of the amplifier 103 shown in FIGURES 5 and 6. The transistor 50 is biased by an AGC voltage that tends to increase the output current from the transistor as the signal increases for both curves *d* and *e*, but the transistor 52 is biased to a fixed point (near maximum gain) for curve *d*, while the transistor 52 receives an AGC voltage that tends to decrease the output current of the transistor as the signal increases, for curve *e*. It will be noted from FIGURE 8 that where less interfering signal amplitude is required to produce 1% cross modulation, the more severe the cross modulation distortion problems. Accordingly, it will seem that the curve *b* represents worse cross modulation conditions than the other curves.

The amplifier circuits corresponding to curves *a*, *d* and *e* have a better performance, with respect to cross modulation distortion, than the amplifier circuit corresponding to curve *c* and which is the circuit that employs a triode vacuum tube as the active element. However, the curve *a* was derived from a circuit which has the disadvantage of undesirably loading the output circuit as aforesaid. For a small AGC range (approximately between zero and 5 *db* attenuation) the preformance of the amplifier circuits which correspond to curves *a*, *d* and *e*.

The AGC range of an amplifier circuit may be defined as the absolute maximum change in the gain of the amplifier circuit at the frequency of operation, or the absolute change in the transconductance of the active element of the amplifier circuit. Thus in FIGURE 8, the AGC range of the amplifier circuits may be measured by the absolute change in attenuation of the desired signal. The AGC range of the circuit corresponding to curve *a* is extended by the losses incurred by the transistor loading of the output tuned circuit.

The amplifier circuit corresponding to curve *b*, is shown to have the worst performance with respect to cross modulation distortion. This is due to the steepness of the slope of the transconductance characteristics as previously explained.

The amplifier circuit of FIGURE 5 (curve *d*) has an AGC range which is primarily dependent on the variation in transconductance of the field-effect transistor 50 in the input stage of the amplifier 103, because the value of transconductance is a function of the gate-to-source bias voltage (as shown in FIGURE 7) and the field-effect transistor 52 is fixed biased.

The circuit of FIGURE 6 provides the advantage of a larger AGC range than the circuit of FIGURE 5. The AGC voltage applied to the output transistor 52 is in the negative direction with increases in signal level thus tending to decrease the output current from the transistor 52 as the input signal increases. This prevents loading of the output circuit with the consequent broadening of the passband characteristic of the amplifier which may result in additional cross modulation distortion in the subsequent stages.

The AGC voltage applied to the transistor 52 may be delayed in a suitable manner so that the transistor 52 does not change its operating point, and hence its transconductance, until the AGC voltage applied to the field-effect transistor 50 causes a predetermined attenuation of the signals (including the interfering signals). This, in effect provides the amplifier 103 with a composite transconductance characteristic which is shown as the curve 114 in FIGURE 7, for example.

For weak signals a positive going AGC voltage is applied between the gate and source electrodes 68 and 58 of the transistor 50, and the circuit 103 exhibits a transconductance following the curve 110. After the signal reaches a predetermined level, the delay is overcome, and a negative going voltage is applied to the gate electrode 82 of the transistor 52. At this point, the curve 114 departs from the curve 110 and moves toward the transconductance curve 111. As the signal level continues to increase, the gate electrode 68 is driven more positively and the gate electrode 82 is driven more negatively, the total $g_m$ of the amplifier drops more rapidly than with AGC applied only to the transistor 50. As can be seen from FIGURE 7, the net effect is that the AGC range, or range of $g_m$ with the circuit of FIGURE 6 is expanded relative to that of FIGURE 5.

What is claimed is:

1. A signal translating circuit comprising, first and second field-effect semiconductor devices each having source and drain electrodes on a substrate of semi-conductor material, and a gate electrode insulated from said substrate, circuit means coupled between said gate and source electrodes of said first field-effect semiconductor device providing a signal input circuit, circuit means coupling said drain electrode of said first field-effect semiconductor device to said source electrode of said second field-effect semiconductor device, circuit means for coupling the gate electrode of said second field-effect semiconductor device to the source electrode of said first field-effect semiconductor device for signal frequencies, and automatic gain control circuit means coupled to said input circuit for applying a control voltage that tends to increase the drain-source current as the level of said input signal increases.

2. In an amplifier circuit of the type including a first insulated-gate field-effect transistor having source, drain and gate electrodes on a substrate of semiconductor material, circuit means coupled between said gate and source electrodes providing a signal input circuit, and a tuned output circuit for deriving an output signal, the combination comprising, automatic gain control means coupled to said gate electrode for applying a control voltage tending to increase the output current of said transistor with increases in applied signal level, and a second like field-effect transistor coupled between said first transistor and said tuned output circuit to provide isolation between the output circuit and said first transistor, whereby impedance variations of said first transistor do not affect the passband characteristic of said output circuit, the gate electrode of said second field-effect transistor being direct current referenced to the source electrode of said second transistor, and being coupled to said source electrode of said first transistor for signal frequencies.

3. In an amplifier circuit of the type including a first insulated-gate field-effect transistor having source, gate and drain electrodes on a substrate of semiconductor material, circuit means coupled between said gate and source electrodes providing a signal input circuit, and the tuned output circuit for deriving an output signal, the combination comprising, automatic gain control means coupled to said gate electrode for applying a control voltage tending to increase the output current of said transistor with increases in applied signal level, a second like field-effect transistor coupled between said first transistor and said tuned output circuit to provide isolation between the output circuit and said first transistor whereby impedance variations of said first transistor do not affect the passband characteristic of the tuned output circuit, said first and second field-effect transistors having the drain-source current paths connected in series, the gate electrode of said second field-effect transistor being referenced to the source electrode of said second transistor for direct current and being referenced to said source electrode of said first transistor for signal frequencies.

4. In combination, first and second field-effect transistors each having source and drain electrodes on a substrate of semiconductor material, and a gate electrode insulated from said substrate, means coupled between the source and gate electrodes of the first field-effect transistor providing a signal input circuit for applying an input signal, means coupling the drain electrode of said first transistor to the source electrode of said second transistor, means coupling the gate electrode of said second transistor to the source electrode of said first transistor for signal frequencies, means coupled to the drain electrode of said second field-effect transistor providing a signal output circuit, automatic gain control circuit means coupled to said input circuit for applying a first control voltage that tends to increase the drain-source current as the level of said input signal increases, and automatic gain control circuit means coupled to said gate electrode of said second transistor for applying a second control voltage that tends to decrease the drain-source current as the level of said input signal increases, said second control voltage being delayed with respect to said first control voltage, so that said second control voltage is not applied until the gain of said first transistor has decreased to a predetermined value.

5. A signal translating circuit comprising, first and second semiconductor devices each having first and second electrodes defining a current path and a control electrode for determining the current flow through said current path, a source of operating potential, a tuned output circuit having a predetermined passband characteristic, circuit means coupling said current paths of said first and second semiconductor devices and said tuned output circuit in series in the order named between a point of fixed reference potential and said source of operating potential, circuit means coupled between the control electrode of said first semiconductor device and said point of reference potential to provide a signal input circuit, automatic gain control circuit means coupled to said input circuit for applying a control voltage that tends to increase the current flow through said current paths as the level of said input signal increases, and means coupling the control electrode of said second semiconductor device to said point of reference potential for signal frequencies.

6. An amplifier circuit comprising, first and second insulated-gate field-effect transistors each having source and drain electrodes defining a current path and a gate electrode that controls the flow of current through said path as a function of the control voltage applied to said gate electrode, each of said transistors having a transconductance characteristic that decreases in value from a point of maximum transconductance at a faster rate when the control voltage applied to said gate electrode tends to increase the current flow through said current path, than when the control voltage applied to said gate electrode tends to decrease the current flow through said current path, at like transconductance values, circuit means coupling the drain electrode of said first transistor to the source electrode of said second transistor, means coupled between the gate and source electrodes of said first transistor for applying input signals to said amplifier circuit, means coupling the gate electrode of said second transistor to the source electrode of said first transistor for signal frequencies, automatic gain control means coupled to said input circuit for applying a control voltage that tends to increase the current flow through said current path of said first transistor as the input signal level increases, and automatic gain control means coupled to said gate electrode of said second transistor for applying a control voltage that tends to decrease the current flow through said current path of said second transistor being delayed with respect to said control voltage applied to said input circuit so that the automatic gain control range of said amplifier circuit is extended without causing additional cross modulation distortion.

7. In an amplifier circuit of the type including a first insulated-gate field-effect transistor having source, drain and gate electrodes on a substrate of semiconductor material, said drain and source electrodes forming a rectifying junction with said substrate, circuit means coupled between said gate and source electrodes providing a signal input circuit, and a tuned output circuit for deriving an output signal, the combination comprising, automatic gain control means coupled to said gate electrode for applying a control voltage tending to increase the output current of said transistor with increases in applied signal level, a second like field-effect transistor coupled between said first transistor and said tuned output circuit to provide isolation between the output circuit and said first transistor, whereby impedance variations of said first transistor do not affect the passband characteristic of said output circuit, the gate electrode of said second field-effect transistor being direct current referenced to the source electrode of said second transistor, and being coupled to said source electrode of said first transistor for signal frequencies, and means connecting said substrate of semiconductor material of said second transistor to said source electrode of said first transistor for reducing signal feedback from said tuned output circuit to said source electrode of said second transistor.

8. A signal translating circuit comprising, first and second semiconductor devices each having first and second electrodes on a substrate of semiconductor material and a control electrode insulated from said substrate said first and second electrodes forming rectifying junctions with said substrate, said first and second electrodes defining a current path and said control electrode determining the current flow through said current path as a function of the control voltage applied thereto, a source of operating potential having positive and negative terminals, said negative terminal being connected to a point of reference potential, a tuned output circuit having a predetermined passband characteristic, circuit means coupling said current paths of said first and second semiconductor devices and said tuned output circuit in series in the order named between said point of fixed reference potential and said positive terminal of said source of operating potential, circuit means coupled between the control electrode of said first semiconductor device and said point of reference potential to provide a signal input circuit, automatic gain control circuit means coupled to said input circuit for applying a control voltage that tends to increase the current flow through said current path of said first semiconductor device as the level of said input signal increases, means coupling said substrate of semiconductor material of each of said first and second semiconductor devices to said point of reference potential to reduce signal feedback between said first semiconductor device and the said second semiconductor device, and means coupling the control electrode of said second semiconductor device to said point of reference potential for signal frequencies to reduce interelectrode signal feedback.

9. A high frequency amplifier circuit comprising, first and second field-effect transistors each having source and drain electrodes on a substrate of semiconductor material, and a gate electrode insulated from said substrate, means coupled between the source and gate electrodes of the first field-effect transistor providing a signal input circuit for applying an input signal, means coupling the drain electrode of said first transistor to the source electrode of said second transistor, means coupling the gate electrode of said second transistor to the source electrode of said first transistor for signal frequencies, circuit means including a capacitor and an inductor connected in parallel to each other, coupled to the drain electrode of said second field-effect transistor providing a signal output circuit, and automatic gain control circuit means separately coupled to said input circuit and to said gate electrode of said second transistor for applying first and second control voltages to said amplifier circuit, said first control voltage tending to increase source-drain current flow for an increase in signal level, and said second control voltage tending to decrease source-drain current flow for the same increase in signal level, said first and second control voltages being applied to said amplifier circuits in away such that said second control voltage is delayed with respect to said first control voltage, whereby the automatic gain control range of said amplifier circuit is extended without increasing cross modulation distortion.

10. In a signal receiver including a second detector circuit, a high frequency amplifier circuit comprising, first and second field-effect semiconductor devices each having source and drain electrodes on a substrate of semiconductor material, and a gate electrode insulated from said substrate, circuit means coupled between said gate and source electrodes of said first field-effect semiconductor device providing a signal input circuit for applying an input signal to be amplified, circuit means coupling said drain electrode of said first field-effect semiconductor device to said source electrode of said second field-effect semiconductor device, circuit means for coupling the gate electrode of said second field-effect semiconductor device to the source electrode of said first field-effect semiconductor device for signal frequencies, a tuned output circuit coupled between said drain electrode of said second transistor and said source electrode of said first transistor for deriving an amplified output signal, means coupling said amplified signal to said second detector circuit, and means coupled between said second detector circuit and said signal input circuit for applying a control voltage that tends to increase the drain-source current as the level of said input signal increases.

References Cited by the Examiner

UNITED STATES PATENTS

| | | | |
|---|---|---|---|
| 3,024,423 | 3/1962 | Azelickis et al. | 330—70 |
| 3,027,518 | 3/1962 | Ketchledge | 330—29 X |

ROY LAKE, *Primary Examiner.*

T. M. WEBSTER, R. P. KANANEN, *Assistant Examiners.*